United States Patent
Reuven (10) Patent No.: US 9,548,708 B2
(45) Date of Patent: Jan. 17, 2017

(54) DIRECTIONAL COUPLERS HAVING VARIABLE POWER RATIOS AND RELATED DEVICES, SYSTEMS, AND METHODS

(71) Applicant: Corning Optical Communications Wireless Ltd, Airport City (IL)

(72) Inventor: Rami Reuven, Rishon Letzion (IL)

(73) Assignee: Corning Optical Communications Wireless Ltd, Airport City (IL)

( * ) Notice: Subject to any disclaimer, the term of this patent is extended or adjusted under 35 U.S.C. 154(b) by 0 days.

(21) Appl. No.: 14/823,325

(22) Filed: Aug. 11, 2015

(65) Prior Publication Data
US 2015/0349735 A1 Dec. 3, 2015

Related U.S. Application Data

(63) Continuation of application No. PCT/IL2014/050196, filed on Feb. 26, 2014.
(Continued)

(51) Int. Cl.
*H01P 5/18* (2006.01)
*H03F 3/60* (2006.01)
(Continued)

(52) U.S. Cl.
CPC . *H03F 3/60* (2013.01); *H01P 3/06* (2013.01); *H01P 5/04* (2013.01); *H01P 5/12* (2013.01);
(Continued)

(58) Field of Classification Search
CPC .............. H01P 5/04; H01P 5/18; H01P 1/22; H03H 7/25
(Continued)

(56) References Cited

U.S. PATENT DOCUMENTS

| | | | | |
|---|---|---|---|---|
| 4,097,827 A | * | 6/1978 | Williams | H03H 7/255 333/81 A |
| 4,109,212 A | * | 8/1978 | Donnell | H03F 1/3252 327/100 |

(Continued)

FOREIGN PATENT DOCUMENTS

RU     SU 1775765 A1 * 11/1992 ................ H01P 1/22

OTHER PUBLICATIONS

Patent Cooperation Treaty, International Report on Patentability for application No. PCT/IL14/050196, dated Sep. 1, 2015, 9 pages.
(Continued)

*Primary Examiner* — Dean Takaoka
(74) *Attorney, Agent, or Firm* — C. Keith Montgomery (57) ABSTRACT

Variable power ratio (VPR) directional couplers that permit an amount of power directed to different outputs to be varied and managed. In some embodiments, the power ratio of the VPR coupler is represented by an equivalent coupling factor C' corresponding to a conventional coupling factor C. The VPR coupler may include one or more variable reactive network (VRN) circuits, each configured to reflect a portion of power received from an input back toward the input, and to transmit a remainder of the power toward an output. An amount of power reflected and transmitted by the VRN circuit may be varied based on a control voltage applied to the VRN circuit. In one example, a plurality of VPR couplers can be arranged in series to create a versatile and simplified network for distributing signals to a plurality of end units.

16 Claims, 7 Drawing Sheets

Related U.S. Application Data (60) Provisional application No. 61/769,808, filed on Feb. 27, 2013.

(51) Int. Cl.

| | | |
|---|---|---|
| *H01P 5/04* | (2006.01) | |
| *H01P 5/12* | (2006.01) | |
| *H01P 3/06* | (2006.01) | |
| *H03F 3/19* | (2006.01) | |
| *H03H 7/48* | (2006.01) | |
| *H03H 11/36* | (2006.01) | |
| *H03H 7/38* | (2006.01) | |

(52) U.S. Cl.
CPC . *H01P 5/18* (2013.01); *H03F 3/19* (2013.01); *H03H 7/48* (2013.01); *H03H 11/36* (2013.01); *H03F 2200/451* (2013.01)

(58) Field of Classification Search
USPC .............. 333/109, 110, 111, 112, 116, 117, 81 A,333/81 R
See application file for complete search history.

(56) References Cited

U.S. PATENT DOCUMENTS

| | | | | |
|---|---|---|---|---|
| 4,517,535 A | * | 5/1985 | Pon | ............ H01P 1/227 333/116 |
| 4,590,417 A | * | 5/1986 | Tanaami | ............ H03H 11/24 323/229 |
| 5,109,204 A | * | 4/1992 | Keefer | ............ H01P 1/22 333/116 |
| 5,233,317 A | * | 8/1993 | Snodgrass | ............ H01P 1/227 333/116 |
| 5,689,217 A | | 11/1997 | Gu et al. | |
| 5,862,464 A | * | 1/1999 | Omagari | ............ H03H 7/255 333/103 |
| 7,456,706 B2 | * | 11/2008 | Blodgett | ............ H01P 9/00 333/139 |
| 7,999,631 B2 | * | 8/2011 | Schemmann | ....... H03M 1/0614 327/308 |
| 8,258,889 B2 | | 9/2012 | Fluhrer | |
| 2010/0171564 A1 | | 7/2010 | Yamamoto et al. | |

OTHER PUBLICATIONS

Patent Cooperation Treaty, International Search Report for application No. PCT/US2014/050196, mail date Jul. 11, 2014, 5 pages.

Mextorf, et al., "Compact cascaded directional couplers with continuously tuneable coupling ratios", Microwave Conference (GEMIC), 2011 German IEEE, Mar. 14, 2011, pp. 1-4, XP031863190.

Chilhyuen, et al., "A New Branch-Line Hybrid Coupler with Arbitrary Power Division Ratio", Microwave Conference, 2007. APMC 2007. Asia-Pacific, IEEE, Piscataway, NJ, USA, Dec. 11, 2007, pp. 1-4, XP031280377.

Ferrero, et al., "Compact quasi-lumped hybrid coupler tunable over large frequency band", Electronics Letters, IEE Stevenage, GB, vol. 43, No. 19, Sep. 13, 2007, pp. 1030-1031, XP006029646.

Mextorf, et al., "Systematic design of reconfigurable quadrature directional couplers", Microwave Symposium Digest, 2009. MTT'09. IEEE MTT-S International, IEEE, Piscataway, NJ, USA, Jun. 7, 2009, pp. 1009-1012, ZP031490692.

* cited by examiner

DIRECTIONAL COUPLERS HAVING VARIABLE POWER RATIOS AND RELATED DEVICES, SYSTEMS, AND METHODS

PRIORITY INFORMATION

This application is a continuation of International App. No. PCT/IL2014/050196, filed Feb. 26, 2014, which claims the benefit of priority to U.S. Provisional App. No. 61/769,808, filed Feb. 27, 2013, the contents of which are incorporated herein by reference in their entireties.

FIELD OF THE DISCLOSURE

The disclosure relates to variable power ratio directional couplers, and more particularly to variable power ratio directional couplers that permit an amount of power directed to different outputs to be varied and managed by a user.

BACKGROUND

Directional couplers are generally used to split and combine radio frequency (RF) signals and other signals among multiple nodes corresponding to signal sources and/or endpoints. Directional couplers are commonly used for "in building" signal distribution between a central source point and multiple endpoints. In these and other applications, directional couplers are used to split a fixed amount of power from a "trunk" input between different "branch" outputs.

Figure 1:
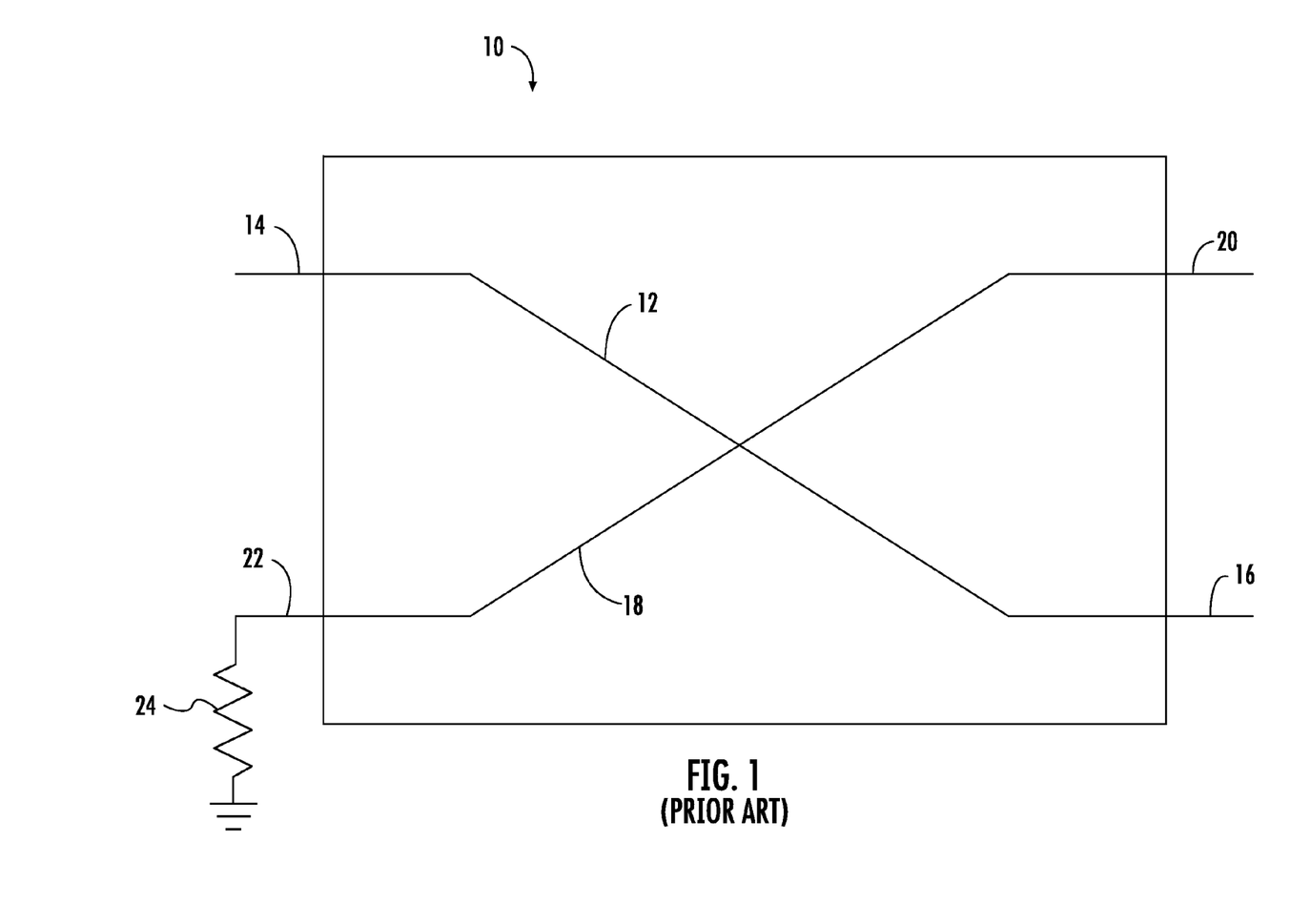
FIG. 1 illustrates a schematic diagram of a conventional directional coupler.

A conventional directional coupler 10 is illustrated in FIG. 1. The conventional directional coupler 10 includes a main coaxial line 12 extending between input port 14 and transmitted port 16, and a coupled coaxial line 18 extending between coupled port 20 and isolated port 22. In conventional directional couplers, such as directional coupler 10 in FIG. 1, the main line 12 and the coupled line 18 are arranged in close proximity. This arrangement permits a portion of input power applied to the input port 14 to be diverted, or "coupled," to the coupled port 20, based on the inductance of the main line 12 and the coupled line 18, and is output at ninety degree (90°) phase to the input signal. The remainder of the input power is transmitted to the transmitted port 16 in phase with the input signal (i.e., at zero degree (0°) phase).

In many applications, the isolated port 22 is connected to a matched load 24 (e.g., a 50 ohm resistor), which is connected to ground to dissipate any power that is reflected back toward the isolated port 22. This matched load 24 can be internal to the directional coupler 10, with the isolated port 22 not accessible to a user, effectively resulting in a three port device.

Conventional directional couplers 10 have a fixed "coupling factor," measured in decibels (dB), that is based on the ratio of the power output at coupled port 20 ($P_{coupled}$) to the power input at input port 14 ($P_{input}$) within a given frequency range. Coupling factor C can be expressed as Equation 1 below.

$$C = -10\log\left(\frac{P_{coupled}}{P_{input}}\right) dB \quad \text{Equation 1}$$

Thus, for a directional coupler 10 that diverts fifty percent (50%) of its input power from input port 14 to the coupled port 20, the coupling factor is −3 dB. −3 dB directional couplers, also known as hybrid couplers, are a common design because they split an input signal from input port 14 equally, with half of the input power being coupled to coupled port 20 and the other half of the input power being transmitted to transmitted port 16. A −6 dB directional coupler is another common type of coupler that couples twenty five percent (25%) of the input power to the coupled port 20 and transmits seventy five percent (75%) of the input power to the transmitted port 16. Likewise, a −10 dB directional coupler couples ten percent (10%) of the input power to the coupled port 20, and transmits ninety percent (90%) of the input power to the transmitted port 16.

Because hybrid couplers are bi-directional, they can be used to coherently combine power in addition to splitting it. For example, when a signal is applied to coupled port 20 of a directional coupler 10 having a coupling factor of −3 dB (a hybrid coupler), and the same signal is applied to the transmitted port 16 at ninety degree (90°) phase to the signal applied to coupled port 20. The signals add to each other at the isolated port 22 because the directional coupler 10 causes both signals output at the isolated port 22 to be in phase with each other. Likewise, the signals output at the input port 14 cancel each other out because the directional coupler 10 causes the signals to be at one hundred eighty degree (180°) phase to each other. Likewise, if the signal applied to transmitted port 16 is instead at ninety degree (90°) phase to the signal applied to the coupled port 20, the signals add at the input port 14 and cancel each other out at the isolated port 22.

Coupling factor C is centered around a particularly rated frequency band. Although the coupling factor C can be made to be relatively flat within the rated frequency band, coupling nevertheless varies with frequency. Therefore, couplers are specified in terms of the coupling accuracy at the frequency band center. However, for common applications, such as RF signal distribution, the coupling factor C of directional couplers 10 can be considered to be effectively constant for those applications.

Coupling factor C is a negative quantity that cannot exceed 0 dB for a passive device such as conventional directional coupler 10. In practice, a coupling factor C does not typically exceed −3 dB since a coupling factor C between −3 dB and 0 dB would result in more power output from the coupled port 20 than power from the transmitted port 16, effectively, reversing the roles of the coupled port 20 and transmitted port 16.

Additional discussion of directional couplers can be found at, for example, en.wikipedia.org/wiki/Power_dividers_and-_directional_couplers (accessed Feb. 1, 2013), U.S. Pat. No. 8,258,889, filed on Nov. 30, 2009 and U.S. Pat. No. 5,689,217, filed on Mar. 14, 1996, which are hereby incorporated by reference herein in their entirety for this purpose.

SUMMARY OF THE DETAILED DESCRIPTION

Embodiments described in the present disclosure include variable power ratio directional couplers (also referred to herein as a "VPR couplers") and related devices, systems and methods. The VPR couplers permit an amount of power directed to different outputs to be varied and managed, including by a user or technician. As a non-limiting example, the VPR couplers disclosed herein could be employed in a distributed antenna system (DAS) to simplify and add flexibility to design and expansion of the DAS. In some embodiments, the power ratio of the VPR coupler is represented by an equivalent coupling factor C' that corresponds to a coupling factor C of a conventional directional coupler. The VPR coupler may include one or more variable reactive network (VRN) circuits, each configured to reflect a portion of power received from an input back toward the input, and to transmit the remainder of the power received at the input toward an output. In some embodiments, the amount of power reflected and transmitted by the VRN circuit may be varied based on one or more control voltages applied to the VRN circuit. In this manner, a plurality of VPR couplers can be arranged in series, for example, to create a versatile and simplified network for distributing signals, such as radio frequency (RF) signals, to a plurality of end units.

In one embodiment, a VPR coupler is disclosed. The VPR coupler comprises a first hybrid coupler having a coupler input and a first coupler output, a second coupler output, and a third coupler output. The VPR coupler further comprises a first variable reactive network having a network input connected to the first coupler output of the first hybrid coupler, a network output, and a control voltage input. The VPR coupler also comprises a second variable reactive network having a network input connected to the second coupler output of the first hybrid coupler, a network output, and a control voltage input. The VPR coupler also comprises a second hybrid coupler having a first coupler input connected to the network output of the first variable reactive network, a second coupler input connected to the network output of the second variable reactive network, and a coupler output. The VPR coupler is configured to receive a first power at the coupler input of the first hybrid coupler, and to receive a control voltage at the control voltage input of the first variable reactive network and the control voltage input of the second variable reactive network. The VPR coupler is further configured to output, based on the control voltage, a second power to the third coupler output of the first hybrid coupler, and output, based on the control voltage, a third power on the coupler output of the second hybrid coupler, wherein the sum of the second power and the third power is the first power.

In another embodiment, a VPR coupler network is disclosed. The VPR coupler network includes a plurality of N VPR couplers. Each VPR coupler comprises a first hybrid coupler having a coupler input and a first coupler output, a second coupler output, and a third coupler output, wherein the coupler input of the first hybrid coupler is a VPR coupler input of the VPR coupler, and the third coupler output of the first hybrid coupler is a VPR coupler output of the VPR coupler. Each VPR coupler also comprises a first variable reactive network having a network input connected to the first coupler output of the first hybrid coupler, a network output, and a control voltage input. Each VPR coupler also comprises a second variable reactive network having a network input connected to the second coupler output of the first hybrid coupler, a network output, and a control voltage input. Each VPR coupler also comprises a second hybrid coupler having a first coupler input connected to the network output of the first variable reactive network, a second coupler input connected to the network output of the second variable reactive network, and a coupler output, wherein the coupler output of the second hybrid coupler is a VPR coupler output of the VPR coupler. The VPR coupler is configured to receive a first power at the coupler input of the first hybrid coupler, and to receive a control voltage at the control voltage input of the first variable reactive network and the control voltage input of the second variable reactive network. The VPR coupler is further configured to output, based on the control voltage, a second power to the third coupler output of the first hybrid coupler, and output, based on the control voltage, a third power on the coupler output of the second hybrid coupler, wherein a sum of the second power and the third power is the first power. The plurality of N VPR couplers is connected in a series, such that the VPR coupler input of each subsequent VPR coupler is connected to one of the VPR coupler outputs the previous VPR coupler, and at least one VPR coupler output of each VPR coupler not connected to a VPR coupler input of another VPR coupler is configured to be connected to an input of one of a plurality of end units.

In another embodiment, a variable reactive network (VRN) circuit is disclosed. The VRN circuit comprises a first varicap having an anode connected to a network input terminal and a cathode connected to an internal node, a second varicap having an anode connected to a network output terminal and a cathode connected to the internal node, a third varicap having an anode connected to a ground node and a cathode connected to the network input terminal, and a fourth varicap having an anode connected to the ground node and a cathode connected to the network output terminal. The VRN circuit further comprises a first resistor having a first terminal connected to the internal node and a second terminal connected to a control voltage input terminal configured to receive a first voltage, a second resistor having a first terminal connected to the network input terminal and a second terminal configured to receive a second voltage, and a third resistor having a first terminal connected to the network output terminal and a second terminal configured to receive the second voltage.

Additional features and advantages will be set forth in the detailed description which follows, and in part will be readily apparent to those skilled in the art from that description or recognized by practicing the embodiments as described herein.

The foregoing general description and the following detailed description are merely exemplary, and are intended to provide an overview or framework to understanding the nature and character of the claims. The drawings illustrate one or more embodiment(s), and together with the description serve to explain principles and operation of the various embodiments.

DETAILED DESCRIPTION

Reference will now be made in detail to the present preferred embodiment(s), examples of which are illustrated in the accompanying drawings. Whenever possible, the same reference numerals will be used throughout the drawings to refer to the same or like parts.

Embodiments described in the present disclosure include variable power ratio directional couplers (also referred to herein as a "VPR couplers") and related devices, systems and methods. The VPR couplers permit an amount of power directed to different outputs to be varied and managed, including by a user or technician. As a non-limiting example, the VPR couplers disclosed herein could be employed in a distributed antenna system (DAS) to simplify and add flexibility to design and expansion of the DAS. In some embodiments, the power ratio of the VPR coupler is represented by an equivalent coupling factor C' that corresponds to a coupling factor C of a conventional directional coupler. The VPR coupler may include one or more variable reactive network (VRN) circuits, each configured to reflect a portion of power received from an input back toward the input, and to transmit the remainder of the power received at the input toward an output. In some embodiments, the amount of power reflected and transmitted by the VRN circuit may be varied based on one or more control voltages applied to the VRN circuit. In this manner, a plurality of VPR couplers can be arranged in series, for example, to create a versatile and simplified network for distributing signals, such as radio frequency (RF) signals, to a plurality of end units.

Figure 2:
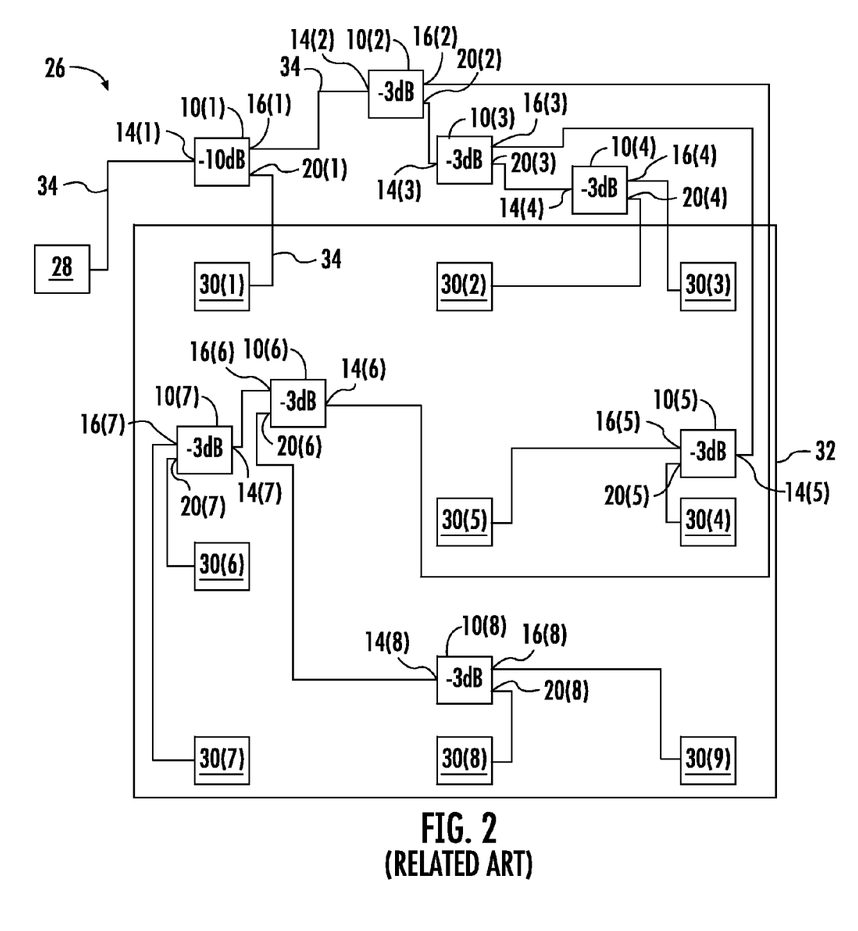
FIG. 2 illustrates a conventional power distribution scheme for a distributed antenna system (DAS) using the conventional directional coupler of FIG. 1.

In this regard, designing power distribution schemes using conventional directional couplers, such as the directional coupler 10 of FIG. 1, can introduce complexity and imprecision. As an example, FIG. 2 illustrates a power distribution scheme for a distributed antenna system (DAS) 26 comprising a plurality of conventional directional couplers 10 and other conventional directional couplers 10. A head-end unit 28 is connected to a plurality of remote units 30 throughout a coverage area 32 via a communications medium 34 (e.g., coaxial cable). To distribute the power to each of the remote units 30, a plurality of directional couplers 10 is disposed throughout the DAS 26 to ensure that the correct amount of power is transmitted to each remote unit 30. In a DAS 26, it can be advantageous to transmit an equal amount of power from the head-end unit 28 to each individual remote unit 30. Thus, to achieve this result, the DAS 26 must be designed to transmit power to each remote unit 30 equal to the total power output by the head-end unit 28 divided by the number of remote units 30.

In many installations using conventional directional couplers, however, design can be complex and imprecise. For each conventional directional coupler 10, the ratios of the input power, transmitted power and coupled power to each other are all fixed. Thus, a careful and specific design is required for every specific project. With continuing reference to FIG. 2, to transmit an equal amount of power to each of the nine remote units 30, the DAS 26 must be designed to transmit 11.11% of the total power from head-end unit 28. However, since conventional directional couplers 10 have standard coupling ratios (e.g. 3 db, 6 db, 10 db etc.), it can be difficult to arrange conventional directional couplers 10 to achieve this exact power distribution.

Even the complex arrangement of the DAS 26 illustrated in FIG. 2 fails to achieve this exact power distribution. In this embodiment, head-end unit 28 outputs an RF signal having a power level (e.g., 100 W). Thus, an ideal distribution would transmit exactly 11.11 W to each remote unit 30. However, in this design, the RF signal is first input into a −10 dB directional coupler 10. The −10 dB directional coupler 10(1) outputs 10 W from its coupled port 20 to remote unit 30(1) and outputs the remaining 90 W from its transmitted port 16 to the input port 14 of hybrid coupler 10(2). The hybrid coupler 10(2) outputs 45 W from each of its transmitted and coupled ports 16, 20 to the respective input ports 14 of hybrid couplers 10(3) and 10(4). Hybrid coupler 10(3) then outputs 22.5 W to each of hybrid couplers 10(5) and 10(6), and hybrid coupler 10(4) likewise outputs 22.5 W to each of hybrid couplers 10(7) and 10(8). Finally, hybrid coupler 10(5) outputs to 11.25 W to each of remote units 30(2) and 30(3); hybrid coupler 10(6) outputs to 11.25 W to each of remote units 30(4) and 30(5); hybrid coupler 10(7) outputs to 11.25 W to each of remote units 30(6) and 30(7); and hybrid coupler 10(8) outputs to 11.25 W to each of remote units 30(8) and 30(9).

One drawback of this design is that remote unit 30(1) receives less power than any of remote units 30(2)-30(9). Conventional solutions to this problem include adding attenuators and/or amplifiers (not shown) to the DAS 26 to reduce or increase the signals along one or more branches of the DAS 26, but this arrangement adds further complexity to an already complex design. In addition, even if a design is achieved that transmits the correct amount of power to each remote unit 30, it can be extremely difficult to change the overall design in any way without redesigning the entire DAS 26. For example, adding even one additional remote unit 30 to the DAS 26 of FIG. 2 would require the power requirements for each remote unit 30 to be recalculated, and would render the illustrated power distribution scheme of FIG. 2 unworkable for its desired purpose.

Therefore, it is apparent that, because the ratio between the input power and the coupled power in conventional directional couplers 10 is fixed, each specific project requires a careful, specific, and inflexible design. For example, when it is desired to divert an equal amount of power to each endpoint, this design can become extremely complicated. For example, since standard directional couplers 10 are used with standard coupling ratios (e.g. −3 db, −6 db, −10 db etc.), delivering an equal power level to the remote end units sometimes requires complicated design work, and can often require additional attenuators and or amplifiers, which add to the cost and complexity of the project. Thus, a directional coupler 10 that does not have one or more of these limitations would be advantageous.

In this regard, embodiments described in the present disclosure include variable power ratio directional couplers (also referred to herein as a "VPR couplers") and related devices, systems and methods. The VPR couplers permit an amount of power directed to different outputs to be varied and managed, including by a user or technician. As a non-limiting example, the VPR couplers disclosed herein could be employed in a distributed antenna system (DAS) to simplify and add flexibility to design and expansion of the DAS. In some embodiments, the power ratio of the VPR coupler is represented by an equivalent coupling factor C' that corresponds to a coupling factor C of a conventional directional coupler. The VPR coupler may include one or more variable reactive network (VRN) circuits, each configured to reflect a portion of power received from an input back toward the input, and to transmit the remainder of the power received at the input toward an output. In some embodiments, the amount of power reflected and transmitted by the VRN circuit may be varied based on one or more control voltages applied to the VRN circuit. In this manner, a plurality of VPR couplers can be arranged in series, for example, to create a versatile and simplified network for distributing signals, such as radio frequency (RF) signals, to a plurality of end units.

Figure 3:
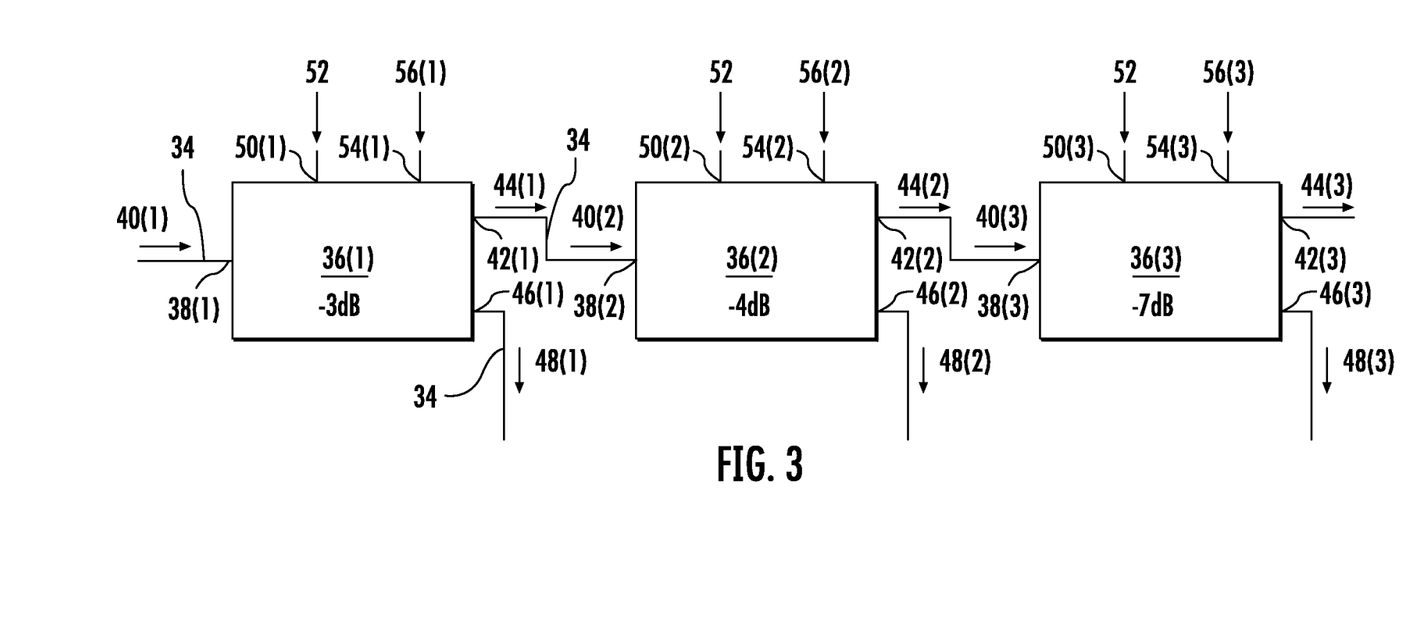
FIG. 3 illustrates an exemplary power distribution scheme comprising a plurality of variable power ratio (VPR) directional couplers according to an exemplary embodiment.

In this regard, FIG. 3 illustrates a power distribution scheme comprising a plurality of VPR couplers 36 according to an embodiment. Each VPR coupler 36 has an input port 38 for receiving an input signal 40 over a communications medium 34. Each VPR coupler 36 also has a transmitted port 42 for outputting a transmitted output signal 44 that is transmitted from VPR coupler 36, and a reflected port 46 for outputting a reflected output signal 48 over the communications medium 34. In this embodiment, a coaxial cable serves as the communications medium 34, but any other suitable media for transmitting RF and other signals are contemplated. Each VPR coupler 36 also includes a reference voltage input 50 for receiving a constant reference voltage 52, and a control voltage input 54 for receiving a variable control voltage 56.

With continuing reference to FIG. 3, when the input signal 40 is received at the input port 38, the VPR coupler 36 divides the input signal 40 according to an equivalent coupling factor C' based on the control voltage 56. As will be discussed in greater detail with respect to FIGS. 4A, 4B, and 5, the control voltage 56 causes the VPR coupler 36 to reflect a percentage of the input signal 40 ($P_{input}$) through the reflected port 46 as the reflected output signal 48 ($P_{reflected}$). In this embodiment, the percentage of the input signal 40 that is reflected through the reflected port 46 is inversely proportional to a magnitude of the control voltage 56. The remainder of the input signal 40 is transmitted through the transmitted port 42 as the transmitted output signal 44. Similar to the coupling factor C of conventional directional couplers 10, the equivalent coupling factor C' can be expressed as Equation 2 below.

$$C' = -10\log\left(\frac{P_{reflected}}{P_{input}}\right) dB \quad \text{Equation 2}$$

Thus, the equivalent coupling factor C' of the VPR coupler 36 can be set to replace a conventional directional coupler 10 having an equivalent coupling factor C', such as a −3 dB (50% coupled), −6 dB (25% coupled), or −10 dB (10% coupled) directional coupler. However, the VPR coupler 36 can also be fine-tuned to any other equivalent coupling factor C', including coupling factors C that are not commonly used in conventional directional couplers 10. Thus, VPR couplers 36 support a much larger variety of power distribution schemes, and permit many existing schemes to be significantly simplified and streamlined.

With continuing reference to FIG. 3, one such simplified power distribution scheme employing VPR couplers 36 is illustrated. Input signal 40(1), having a power of 100 watts (W) in this example, is received at input port 38(1) of VPR coupler 36(1). Based on control voltage 56(1), the equivalent coupling factor C' of VPR coupler 36(1) is −3 dB. Thus, a 5 W (50%) reflected output signal 48(1) is output over reflected port 46(1), and a 5 W (50%) transmitted output signal 44(1) is transmitted over transmitted port 42(1). Reflected port 46(1) may be connected via the communications medium 34 to another device, such as a remote unit or another directional coupler (not shown).

With continuing reference to FIG. 3, the five watt (5 W) transmitted output signal 44(1) is received at input port 38(2) as input signal 40(2) via the communications medium 34. Based on control voltage 56(2), the equivalent coupling factor C' of VPR coupler 36(2) is −4 dB. Thus, a 2 W (40%) reflected output signal 48(2) is output over reflected port 46(2), and a 3 W (60%) transmitted output signal 44(2) is transmitted over transmitted port 42(2). Similar to reflected port 46(1), reflected port 46(2) may be connected via the communications medium 34 to another device, such as a remote unit or another directional coupler (not shown).

As discussed above, the 3 W transmitted output signal 44(1) is received at input 38(2) as input signal 40(2) via communications medium 34. Based on control voltage 56(2), the equivalent coupling factor C' of VPR coupler 36(2) is −7 dB. Thus, a 0.6 W (20%) reflected output signal 48(2) is output over reflected port 46(2), and a 2.4 W (80%) transmitted output signal 44(2) is transmitted over transmitted port 42(2). Similar to reflected ports 46(1) and 46(2), reflected port 46(3) and transmitted port 42(3) may each be connected via the communications medium 34 to another device, such as a remote unit or another directional coupler (not shown).

It should be noted that, in some embodiments, a maximum equivalent coupling factor C' may be set at −3 dB. For example, reflecting more than fifty percent (50%) of the input signal 40 through the reflected port 46 using an equivalent coupling factor C' greater than −3 dB is functionally equivalent to transmitting the same proportion of the input signal 40 through the transmitted port 42 using an equivalent coupling factor C' smaller than −3 dB. In other embodiments, any equivalent coupling factor C' may be used to transmit any proportion of the input signal 40 to both the reflected port 46 and the transmitted port 42.

Figure 4A:
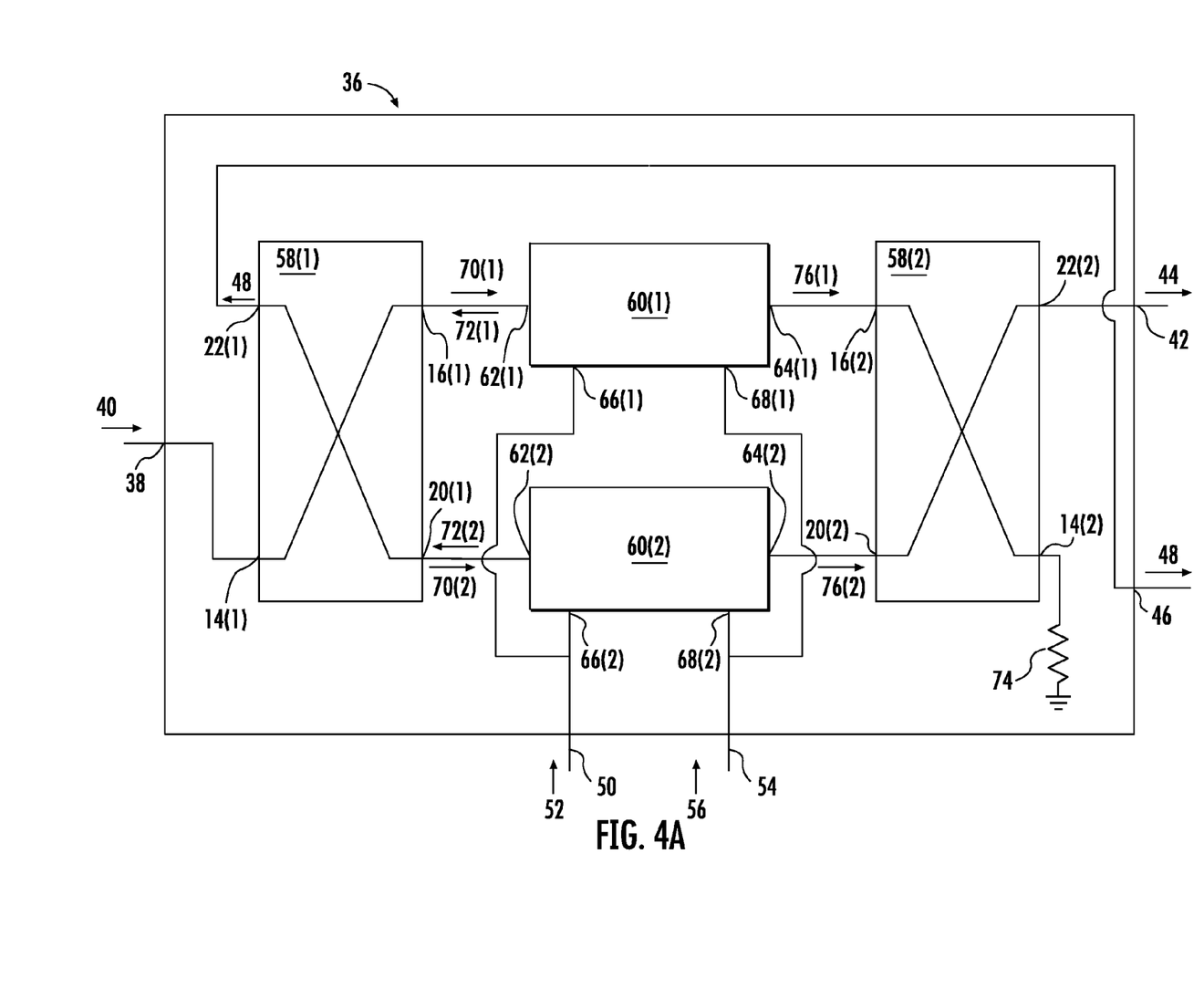
FIG. 4A illustrates a schematic diagram of the plurality of VPR couplers of FIG. 3 according an exemplary embodiment.

Referring now to FIG. 4A, a detailed schematic of a VPR coupler 36 that supports varying power ratios is illustrated according to an exemplary embodiment. The VPR coupler 36 includes a two hybrid couplers 58(1), 58(2) with two VRN circuits 60(1), 60(2) connected therebetween. Each VRN circuit 60 has an input port 62, an output port 64, a reference voltage input port 66, and a control voltage input port 68.

With continuing reference to FIG. 4A, input port 14(1) of hybrid coupler 58(1) is connected to input port 38 of the VPR coupler 36, and isolated port 22(1) of hybrid coupler 58(1) is connected to reflected port 46. Transmitted port 16(1) of hybrid coupler 58(1) is connected to the input port 62(1) of VRN circuit 60(1). Coupled port 20(1) of hybrid coupler 58(1) is connected to the input port 62(2) of VRN circuit 60(2). Thus, input signal 40 (10 W, in this example) is initially split by the hybrid coupler 58(1), with half of the power of input signal 40 (5 W) being applied to input port 62(1) of VRN circuit 60(1) as VRN input signal 70(1); the other half of input signal 40 (5 W) is applied to input port 62(2) as VRN input signal 70(2) of VRN circuit 60(2) at ninety degree (90°) phase.

Output port 64(1) of VRN circuit 60(1) is connected to transmitted port 16(2) of hybrid coupler 58(2), and output port 64(2) of VRN circuit 60(2) is connected to coupled port 20(2) of hybrid coupler 58(2). In addition, the reference voltage input port 66(1) of VRN circuit 60(1) and reference voltage input port 66(2) of VRN circuit 60(2) are both connected to reference voltage input port 50 of the VPR coupler 36. Likewise, the control voltage input port 68(1) of VRN circuit 60(1) and the control voltage input port 68(2) of VRN circuit 60(2) are both connected to control voltage input port 54 of the VPR coupler 36. Thus, in this embodiment, the constant reference voltage 52 is applied equally to both VRN circuits 60(1), 60(2), and the variable control voltage 56 is also applied equally to both VRN circuits 60(1), 60(2).

Based on the applied control voltage 56, a percentage (40% in this example) of the input signal 70(1) received at the input port 62(1) of VRN circuit 60(1) (2 W) is reflected back toward the transmitted port 16(1) of hybrid coupler 58(1) as VRN reflected signal 72(1). Likewise, the same percentage of the input signal 70(1) (still at 90° phase) received at the input port 62(2) of VRN circuit 60(2) (2 W) is reflected back toward the coupled port 20(1) of hybrid coupler 58(1) as VRN reflected signal 72(2). In this embodiment, input port 14(2) of hybrid coupler 58(2) is not used and is therefore connected to a matched load 74 (e.g., a 50 ohm resistor), which is in turn connected to ground.

It should be noted that, similar to the VPR coupler 36, each VRN circuit 60 also has its own equivalent coupling factor C'. Because of the design of VPR coupler 36 in this embodiment, the equivalent coupling factor C' of each of the VRN circuits 60(1), 60(2) will be equal to each other, and will also be equal to the equivalent coupling factor C' of the VPR coupler 36. However, in other embodiments, a VPR coupler 36 may be designed having VRN circuits 60 with different equivalent coupling factors C' from each other and/or from the equivalent coupling factor C' of the VPR coupler 36.

With continuing reference to FIG. 4A, VRN reflected signal 72(1), received at transmitted port 16(1) of hybrid coupler 58(1), is at zero degrees (0°) phase and VRN reflected signal 72(2), received at coupled port 20(1) of hybrid coupler 58(1), is at ninety degree (90°) phase. As discussed above with respect to FIG. 1, if an RF signal is input into hybrid coupler 58(1) (which is a directional coupler 10 having a coupling factor of −3 dB), the transmitted port 16(1) will output fifty percent (50%) of the input signal in phase with the input signal, and the coupled port 20(1) will output fifty percent (50%) of the input signal ninety degrees (90°) out of phase with the input signal. Likewise, if a portion of each power output at the transmitted port 16(1) and coupled port 20(1) are reflected back into the hybrid coupler 58(1) in equal proportion, the power reflected at the transmitted port 16(1) will combine perfectly with the power reflected at coupled port 20(1), because the signal reflected at coupled port 20(1) is ninety degrees (90°) out of phase with the signal received at the transmitted port 16(1). Meanwhile, none of the reflected power is diverted back to the input port 14(1) because the signals are one hundred eighty degrees (180°) out of phase with each other and therefore cancel each other out. The combined power will output at isolated port 22(1) in phase with the signal received at the transmitted port 16(1). Thus, VRN reflected signals 72(1) and 72(2) combine perfectly and output to isolated port 22(1) of hybrid coupler 58(1) as reflected output signal 48 (4 W), which is then output to reflected port 46 of VPR coupler 36.

The remainder of the input signal 70(1) received at the input port 62(1) of VRN circuit 60(1) (3 W, or 60% of the input signal) is transmitted toward the transmitted port 16(2) of hybrid coupler 58(2) as VRN transmitted signal 76(1). Likewise, the same percentage (60%) of the input signal 70(2) (still at 90° phase) received at input port 62(2) of VRN circuit 60(2) (3 W) is transmitted toward the coupled port 20(2) of hybrid coupler 58(2) as VRN transmitted signal 76(2). VRN transmitted signal 76(1), received at transmitted port 16(2) of hybrid coupler 58(2), is at zero degrees) (0° phase and VRN transmitted signal 76(2), received at coupled port 20(2) of hybrid coupler 58(2), is at ninety degree (90°) phase. Thus, in a manner similar to hybrid coupler 58(1), the VRN transmitted signals 76(1) and 76(2) combine perfectly and output to the isolated port 22(2) of hybrid coupler 58(2) as transmitted output signal 44 (6 W), which is then output to transmitted port 42 of VPR coupler 36.

Thus, it can be seen that, by controlling the reflectivity of the VRN circuits 60(1), 60(2) with the applied control voltage 56, the proportion of input signal 40 that is split between transmitted port 42 and reflected port 46 can be fine-tuned. In this manner, VPR coupler 36 can be adjusted to any equivalent coupling factor C'. By setting and fine tuning the equivalent coupling factor C' of VPR coupler 36, the power ratio output from the VPR coupler 36 may be varied, for example, according to parameters or requirements of a particular design project.

In some embodiments, the ports 14, 16, 20, 22 of hybrid couplers 58(1) and 58(2) can be reassigned within the VPR coupler 36 without affecting the functionality of the VPR coupler 36. Because the hybrid couplers 58(1) and 58(2) split and combine signals in equal proportion, the port arrangement of either hybrid coupler 58(1), 58(2) can be flipped horizontally, vertically, or both without affecting the operation of the VPR coupler 36. Thus, although the various ports 14, 16, 20, 22 are arranged as shown in FIGS. 4A and 4B for clarity, it should be noted that the claims are not so limited, and that different configurations are contemplated.

Figure 4B:
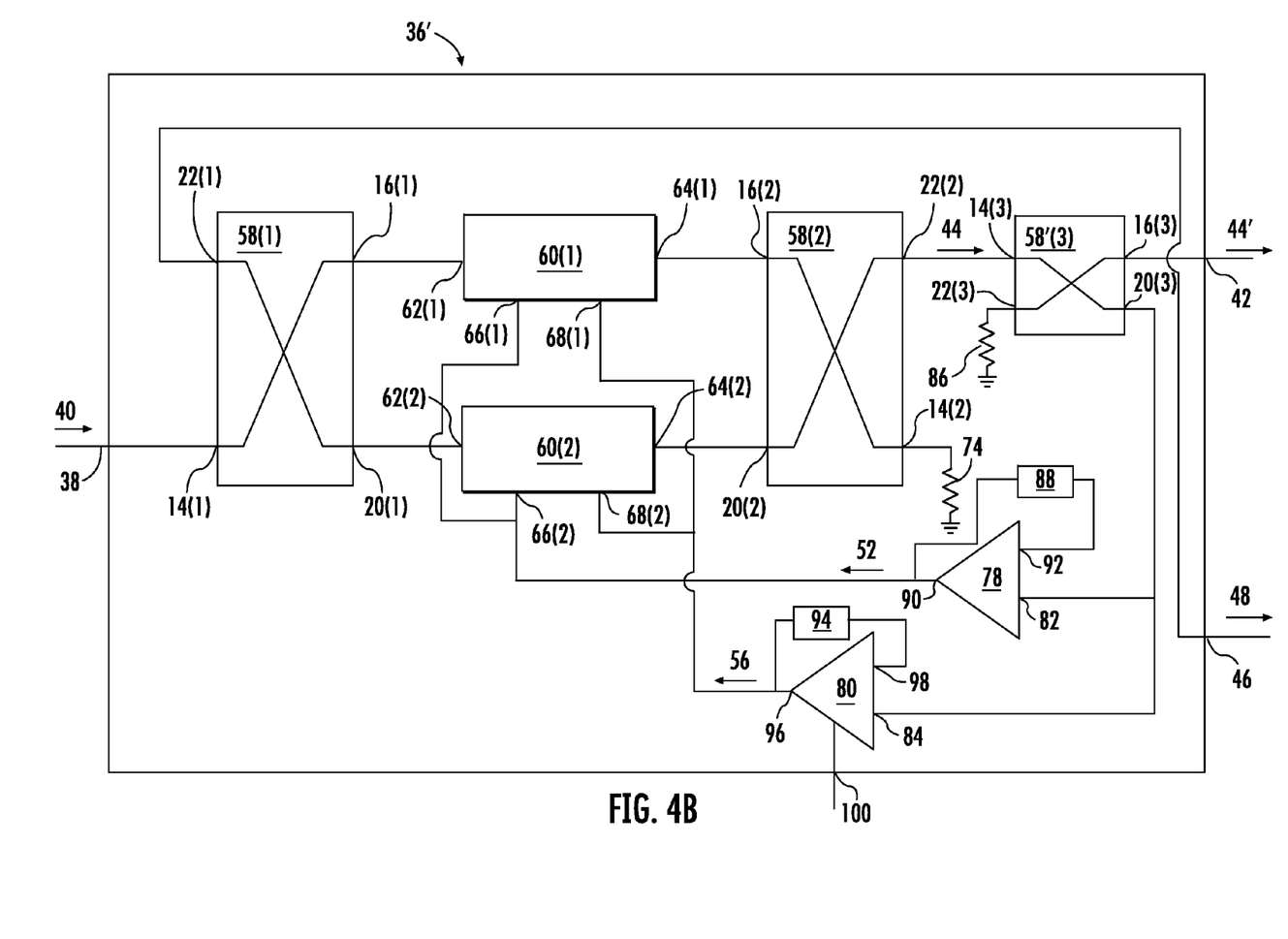
FIG. 4B illustrates a schematic diagram of the plurality of VPR couplers of FIG. 3 having internal control voltage circuits according to an alternative embodiment.

In some embodiments, such as the embodiment of FIG. 4B, a VPR coupler 36' can include internal circuitry for providing the reference voltage 52 and the control voltage 56 to the VRN circuits 60(1), 60(2) using a small portion of the input signal 40. For example, FIG. 4B illustrates a schematic of a VPR coupler 36' having these features for varying the power ratio of VPR coupler 36'. In this embodiment, VPR coupler 36' does not have an external reference voltage input port 50 or control voltage input port 54. Instead, a tap coupler 58'(3) is disposed between the isolated port 22(2) of hybrid coupler 58(2) and transmitted port 42 of VPR coupler 36'. The tap coupler 58'(3) routes a small amount (<1%) of power to a reference amplifier 78 and a control amplifier 80. The reference amplifier 78 then applies reference voltage 52 to reference voltage input ports 66(1), 66(2) of VRN circuits 60(1), 60(2), and the control amplifier 80 applies control voltage 56 to control voltage input ports 68(1), 68(2) of VRN circuits 60(1), 60(2).

The tap coupler 58'(3) is a directional coupler having a very low coupling factor C. The transmitted output signal 44 is received at input port 14(3) of tap coupler 58'(3) and is output as transmitted output signal 44' over the transmitted port 16(3) of tap coupler 58'(3) to the transmitted port 42 of VPR coupler 36'. Because the coupling factor C of tap coupler 58'(3) is very low, power lost by transmitted output signal 44 is also very low. Thus, in many embodiments, transmitted output signal 44' can be considered to be equivalent to transmitted output signal 44.

Coupled port 20(3) is connected to a first input 82 of reference amplifier 78 and a first input 84 of control amplifier 80. Isolated port 22(3) is connected to a matched load 86 (e.g., 50 ohm resistor), which is in turn connected to ground. Thus, when the transmitted output signal 44 is received at input port 14(3) of tap coupler 58'(3), a minimal percentage of power of the transmitted output signal 44 is output over the coupled port 20(3) of tap coupler 58'(3) to the first inputs 82, 84 of the respective amplifiers 78, 80.

A reference amplifier feedback circuit 88 is connected between a reference amplifier output 90 and a second input 92 of reference amplifier 78 for regulating the reference voltage 52 provided to reference voltage input ports 66(1), 66(2) of VRN circuits 60(1), 60(2). Likewise, a control feedback circuit 94 connected between control amplifier output 96 and a second input 98 of control amplifier 80 for regulating the control voltage 56 provided to control voltage input ports 68(1), 68(2) of VRN circuits 60(1), 60(2). In addition, a tuning port 100 is connected to control amplifier 80 such that the control voltage 56 can be varied by a user. For example, in some embodiments, the VPR coupler 36' can include a manual tuner, such as a potentiometer (not shown), connected to the tuning port 100 for manually adjusting the control voltage 56, thereby adjusting the equivalent coupling factor C' of the VPR coupler 36'.

Figure 5:
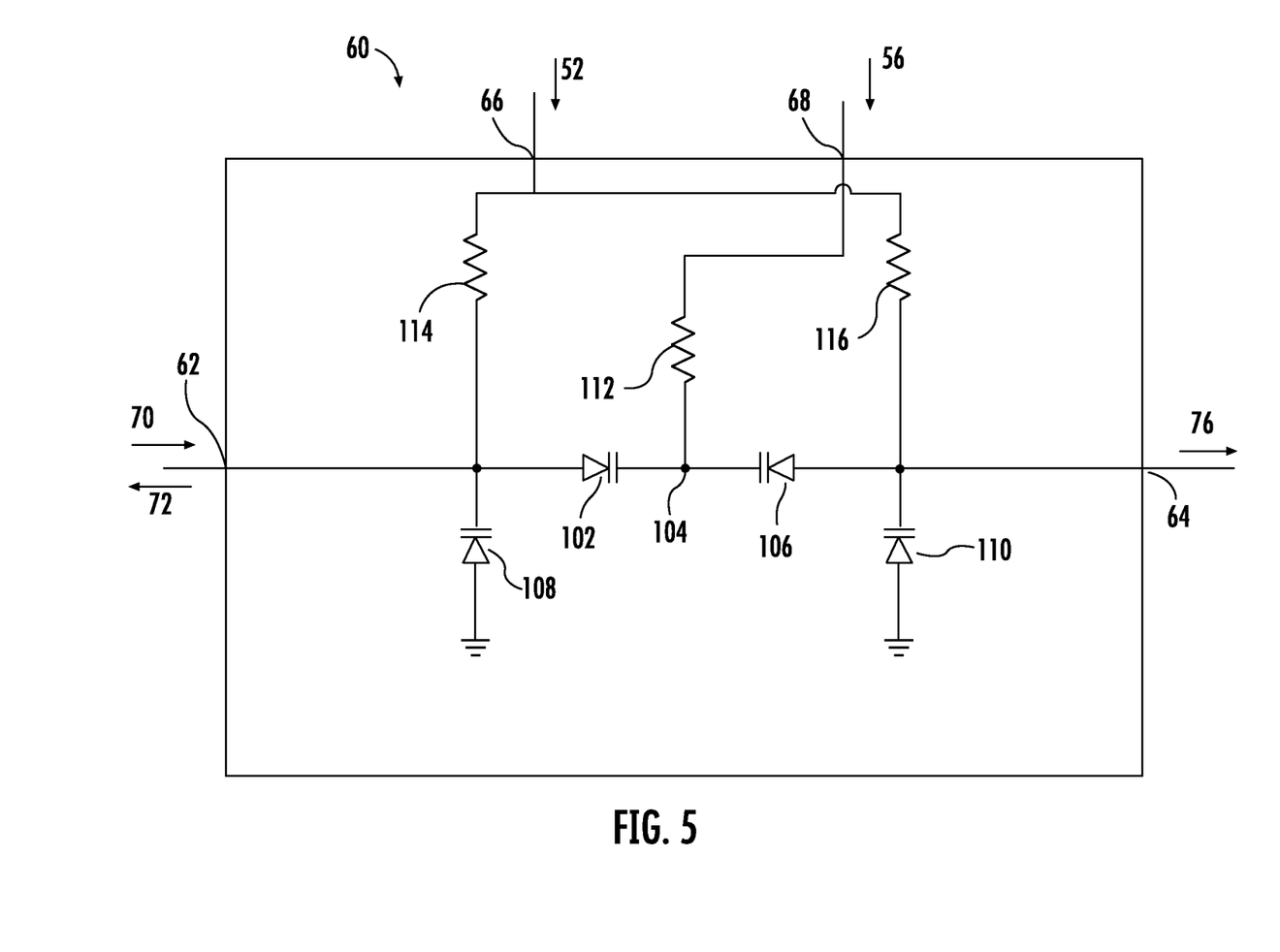
FIG. 5 illustrates a schematic diagram of an exemplary variable reactive network (VRN) circuit according to the embodiments of FIGS. 4A and 4B.

As discussed above with respect to FIGS. 4A and 4B, adjusting the control voltage 56 in turn adjusts the reflectivity of each VRN circuit 60. Referring now to FIG. 5, a detailed schematic view of an exemplary VRN circuit 60 is illustrated. The VRN circuit 60 includes a network of capacity diodes (also known as varicaps, varactors, or tuning diodes) and resistors connected to the input port 62, output port 64, reference voltage input port 66, and control voltage input port 68.

With continuing reference to FIG. 5, a first varicap 102 has an anode connected to the input port 62 of the VRN circuit 60 and a cathode connected to an internal node 104 of the VRN circuit 60. A second varicap 106 is arranged symmetrically with the first varicap 102, and has an anode connected to the output port 64 of the VRN circuit 60 and a cathode connected to the internal node 104 of the VRN circuit 60. A third varicap 108 has an anode connected to ground and a cathode connected to the input port 62 of the VRN circuit 60. A fourth varicap 110 is arranged symmetrically with the third varicap 108, and has an anode connected to ground and a cathode connected to the output port 64 of the VRN circuit 60.

With continuing reference to FIG. 5, a first resistor 112 has a first terminal connected to the internal node 104 of the VRN circuit 60, and a second terminal connected to the control voltage input port 68 of the VRN circuit 60. A second resistor 114 has a first terminal connected to the input port 62 of VRN circuit 60, and a second terminal connected to the reference voltage input port 66 of VRN circuit 60. A third resistor 116 is arranged symmetrically with the second resistor 114, and is connected to the output port 64 of the VRN circuit 60 and a second terminal connected to the reference voltage input port 66 of VRN circuit 60.

As discussed above with respect to FIGS. 4A and 4B, the constant reference voltage 52 is applied to reference voltage input port 66, and variable control voltage 56 is applied to control voltage input port 68. Varicaps generally have a capacitance that varies in inverse proportion to an applied voltage. Thus, the difference between the reference voltage 52 and control voltage 56 affects the capacitance of each of the varicaps 102 and 106. The capacitance of each of the varicaps 102 and 106 in turn determines the reflectivity factor Γ of the VRN circuit 60. Thus, based on a value of the control voltage 56, the network of varicaps 102, 106, 108, 110 and resistors 112, 114, 116 cause a percentage of the VRN input signal 70 to be reflected back to input port 62 as VRN reflected signal 72 that is inversely proportional to control voltage 56. In this embodiment, because the VRN circuits 60(1), 60(2) are identical and receive the same control voltage 56 and reference voltage 52, the reflectivity factor Γ is the same for both VRN circuits 60(1), 60(2). The reflectivity factor Γ of VRN circuits 60(1), 60(2) is therefore equal to the total power reflected by the VRN circuits 60(1), 60(2) divided by the total power input into the VRN circuits 60(1), 60(2), resulting in a value between zero (0) and one (1.0). It follows that equivalent coupling factor C' of VPR coupler 36' can be represented by Equation 3 below:

$$C' = -10 \log(\Gamma) \, dB \quad \text{Equation 3:}$$

The remainder of the VRN input signal 70 is transmitted to output port 64 as the VRN transmitted signal 76. In this manner, the power ratio of the VPR coupler, such as VPR couplers 36, 36', may be varied.

Figure 6:
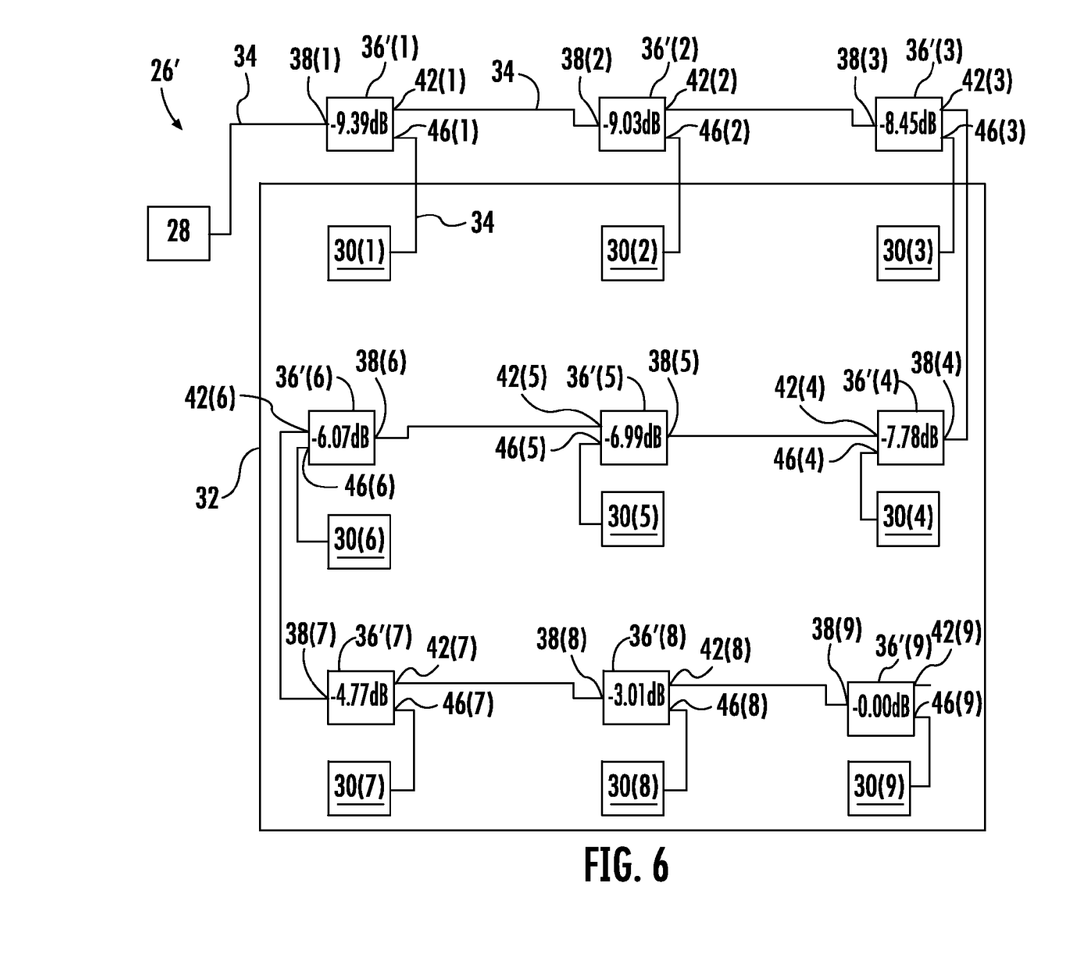
FIG. 6 illustrates a power distribution scheme for the DAS similar to the DAS of FIG. 2 using a plurality of VPR couplers of FIG. 4B according to an exemplary embodiment.

Thus, because each VPR coupler 36 can be fine-tuned to any effective coupling factor C, design and modification of a power distribution scheme, e.g., for the DAS 26 of FIG. 2, becomes substantially simplified. For example, FIG. 6 illustrates an exemplary power distribution scheme for a modified DAS 26' using a plurality of VPR couplers 36' as described above with respect to FIG. 4B. DAS 26' has the same arrangement of head-end unit 28 and remote units 30 within the coverage area 32 as DAS 26, described above with respect to FIG. 2. Like DAS 26 of FIG. 2, an ideal power distribution scheme would transmit 11.11% of the power output from head-end unit 28 to each remote unit 30. Thus, when the head-end unit 28 outputs a 100 W RF signal, the power distribution scheme should be designed such that each remote unit 30 receives exactly 11.11 W of power.

With continuing reference to FIG. 6, head-end unit 28 outputs a 100 W RF signal to VPR coupler 36'(1). In order to output 11.11 W of power to the remote unit 30(1) via the reflected port 46(1) of the VPR coupler 36'(1), the equivalent coupling factor C' of VPR coupler 36'(1) is set to −9.54 dB, for example, via a tuner (not shown) connected to a tuning port 100 (see FIG. 4B).

The remaining 88.89 W of power is output to the input port 38(1) of VPR coupler 36'(2) via the transmitted port 42(1) of VPR coupler 36'(1). VPR coupler 36'(2) is set to an equivalent coupling factor C' of −9.03, thereby outputting 11.11 W of power to remote unit 30(2) via the reflected port 46(2) of VPR coupler 36'(2), and outputting the remaining 77.78 W of power to the input port 62(3) of VPR coupler 36'(3) via the transmitted port 42(2) of VPR coupler 36'(2).

In this manner, each subsequent VPR coupler 36' is set so that a precise amount of power is sent to each remote unit 30. VPR coupler 36'(3) is set to an equivalent coupling factor C' of −8.45, thereby outputting 11.11 W of power to remote unit 30(3) via the reflected port 46(3) of VPR coupler 36'(3), and outputting the remaining 66.67 W of power to the input port 62(4) of VPR coupler 36'(4) via the transmitted port 42(3) of VPR coupler 36'(3). VPR coupler 36'(4) is set to an equivalent coupling factor C' of −7.78, thereby outputting 11.11 W of power to remote unit 30(4) via the reflected port 46(4) of VPR coupler 36'(4), and outputting the remaining 55.56 W of power to the input port 62(5) of VPR coupler 36'(5) via the transmitted port 42(4) of VPR coupler 36'(4). VPR coupler 36'(5) is set to an equivalent coupling factor C' of −6.99, thereby outputting 11.11 W of power to remote unit 30(5) via the reflected port 46(5) of VPR coupler 36'(5), and outputting the remaining 44.44 W of power to the input port 62(6) of VPR coupler 36'(6) via the transmitted port 42(5) of VPR coupler 36'(5). VPR coupler 36'(6) is set to an equivalent coupling factor C' of −6.07, thereby outputting 11.11 W of power to remote unit 30(6) via the reflected port 46(6) of VPR coupler 36'(6), and outputting the remaining 33.33 W of power to the input port 62(7) of VPR coupler 36'(7) via the transmitted port 42(6) of VPR coupler 36'(6). VPR coupler 36'(7) is set to an equivalent coupling factor C' of −4.77, thereby outputting 11.11 W of power to remote unit 30(7) via the reflected port 46(7) of VPR coupler 36'(7), and outputting the remaining 22.22 W of power to the input port 62(8) of VPR coupler 36'(8) via the transmitted port 42(7) of VPR coupler 36'(7). VPR coupler 36'(8) is set to an equivalent coupling factor C' of −3.01, thereby outputting 11.11 W of power to VPR coupler 36'(9) via the reflected port 46(8) of VPR coupler 36'(8), and outputting the remaining 77.78 W of power to the input port 62(9) of VPR coupler 36'(9) via the transmitted port 42(8) of VPR coupler 36'(8). In this embodiment, VPR coupler 36'(9) is set to have an equivalent coupling factor C' of 0.00 dB, thereby outputting one hundred percent (100%) of its power (11.11 W) to remote unit 30(9). In this embodiment, VPR coupler 36'(9) is included to provide a free output port (transmitted port 42(9) in this embodiment) for easily connecting additional remote units 30. Alternatively, VPR coupler 36'(9) may be omitted, with the 11.11 W of power being transmitted directly to remote unit 30(9). In another alternative embodiment, VPR coupler 36'(9) can be replaced with a conventional hybrid coupler 10 because the equivalent coupling factor C' of VPR coupler 36'(9) is approximately −3 dB, which is equal to the coupling factor C of a conventional hybrid coupler 10.

It is therefore apparent that for applications, such as DAS 26', that may require an equal amount of power to be delivered to a plurality of endpoints, such as remote units 30, a power distribution scheme can be designed that arranges a plurality of VPR couplers 36 in series, such that the input port 62 of each subsequent VPR coupler 36 is connected to one of the output ports 64 of the previous VPR coupler 36, and such that at least one output port 64 of each VPR coupler 36 not connected to an input port 62 of another VPR coupler 36 is configured to be connected to an input port 62 of one of a plurality of end units.

In one embodiment, each of the plurality of VPR couplers 36 receives a respective control voltage 56 such that the output port 64 of each VPR coupler 36 not connected to the input port 62 of another VPR coupler 36 is configured to output (100/N) % of the power received at the input port 62 of the first VPR coupler 36 in the series. Thus, in this embodiment, the VPR coupler 36(N) is configured to transmit one hundred percent (100%) of its received power to one end unit with the second output available for a future system expansion and/or modification.

In another embodiment, each of the plurality of VPR couplers 36 is configured to receive a respective control voltage 56 such that the output port 64 of each VPR coupler 36 not connected to the input port 62 of another VPR coupler 36 (i.e., connected to an endpoint) is configured to output (100/(N+1))% of the power received at the input port 62 of the VPR coupler 36 in the series. Thus, in this embodiment, the VPR coupler 36(N) is configured to transmit an equal amount of power to two respective end units, such as the arrangement of VPR coupler 36(8) and remote units 30(8) and 30(9) of FIG. 6.

In the modified power distribution scheme according to the above embodiment, each of the plurality of VPR couplers 36 is configured to receive a control voltage 56 such that the output port 64 of each VPR coupler 36 not connected to the input port 62 of another VPR coupler 36 (i.e., connected to an endpoint) is configured to output (100/(N+2))% of the power received at the input port 62 of the VPR coupler 36 in the series. In this embodiment, the VPR coupler 36(N) is configured to transmit its remaining power to a conventional hybrid coupler 10, which then divides the remaining power equally between two end units, similar to the alternate embodiment described above with respect to FIG. 6.

The terms "fiber optic cables" and/or "optical fibers" include all types of single mode and multi-mode light waveguides, including one or more optical fibers that may be upcoated, colored, buffered, ribbonized and/or have other organizing or protective structure in a cable such as one or more tubes, strength members, jackets or the like. Many modifications and other embodiments of the embodiments set forth herein will come to mind to one skilled in the art to which the embodiments pertain having the benefit of the teachings presented in the foregoing descriptions and the associated drawings. Therefore, it is to be understood that the description and claims are not to be limited to the specific embodiments disclosed and that modifications and other embodiments are intended to be included within the scope of the appended claims. It is intended that the embodiments cover the modifications and variations of the embodiments provided they come within the scope of the appended claims and their equivalents. Although specific terms are employed herein, they are used in a generic and descriptive sense only and not for purposes of limitation.

What is claimed is:

1. A variable power ratio directional (VPR) coupler, comprising:
   a first hybrid coupler having an input and a first coupler output, a second coupler output, and third coupler output;
   a first variable reactive network (VRN) having a network input connected to the first coupler output of the first hybrid coupler, a network output, and a control voltage input;
   a second VRN having a network input connected to the second coupler output of the first hybrid coupler, a network output, and a control voltage input;
   a second hybrid coupler having a first coupler input connected to the network output of the first VRN, a second coupler input connected to the network output of the second VRN, and a coupler output;
   wherein the VPR coupler is configured to:
      receive a first power at the coupler input of the first hybrid coupler;
      receive a control voltage at the control voltage input of the first VRN and the control voltage input of the second VRN;
      output a second power to the third coupler output of the first hybrid coupler, based on the control voltage; and
      output a third power to the coupler output of the second hybrid coupler, based on the control voltage, wherein a sum of the second power and the third power is the first power; and
   an amplifier configured to supply the control voltage to the first and second VRNs, wherein an amplifier input of the amplifier is configured to receive a portion of the third power from the output of the second hybrid coupler.

2. The VPR coupler of claim 1, wherein:
   the first VRN is configured to:
      receive a fourth power at the network input of the first VRN;
      reflect a reflected portion of the fourth power at the network input of the first VRN based on the control voltage; and
      output a remainder of the fourth power at the network output of the first VRN, wherein a sum of the reflected portion and the remainder of the fourth power is the fourth power; and
   the second VRN is configured to:
      receive a fifth power at the network input of the second VRN;
      reflect a reflected portion of the fifth power at the network input of the second VRN based on the control voltage; and output a remainder of the fifth power at the network output of the second VRN, wherein a sum of the reflected portion and the remainder of the fifth power is the fifth power.

3. The VPR coupler of claim 2, wherein the first hybrid coupler is configured to:
split the first power into the fourth power and the fifth power;
output the fourth power at the first coupler output of the first hybrid coupler;
output the fifth power at the second coupler output of the first hybrid coupler;
receive the reflected portion of the fourth power from the first VRN at the first coupler output of the first hybrid coupler;
receive the reflected portion of the fifth power from the second VRN at the second coupler output of the first hybrid coupler; and
combine the reflected portion of the fourth power and the reflected portion of the fifth power into the second power.

4. The VPR coupler of claim 3, wherein the second hybrid coupler is configured to:
receive the remainder of the fourth power from the first VRN at the first coupler input of the second hybrid coupler;
receive the remainder of the fifth power from the second VRN at the second coupler input of the second hybrid coupler; and
combine the remainder of the fourth power and the remainder of the fifth power into the third power.

5. The VPR coupler of claim 2, wherein the second hybrid coupler is configured to:
receive the remainder of the fourth power from the first variable reactive network at the first coupler input of the second hybrid coupler;
receive the remainder of the fifth power from the first variable reactive network at the second coupler input of the second hybrid coupler;
combine the remainder of the fourth power and the remainder of the fifth power into the third power.

6. The VPR coupler of claim 1, wherein the first VRN comprises:
a first varicap having an anode connected to the network input of the first VRN and a cathode connected to an internal node;
a second varicap having an anode connected to the network output of the first VRN and a cathode connected to the internal node;
a third varicap having an anode connected to a ground node and a cathode connected to the network input of the first VRN;
a fourth varicap having an anode connected to the ground node and a cathode connected to the network output of the first VRN;
a first resistor having a first terminal connected to the internal node and a second terminal connected to the control voltage input of the first VRN;
a second resistor having a first terminal connected to the input of the first VRN and a second terminal configured to receive a reference voltage; and
a third resistor having a first terminal connected to the network output of the first VRN and a second terminal configured to receive the reference voltage.

7. The VPR coupler of claim 6, wherein the second VRN comprises:
a first varicap having an anode connected to the network input of the second VRN and a cathode connected to an internal node;
a second varicap having an anode connected to the network output of the second VRN and a cathode connected to the internal node;
a third varicap having an anode connected to a ground node and a cathode connected to the network input of the second VRN;
a fourth varicap having an anode connected to the ground node and a cathode connected to the network output of the second VRN;
a first resistor having a first terminal connected to the network internal node and a second terminal connected to the control voltage input of the second VRN;
a second resistor having a first terminal connected to the network input of the second VRN and a second terminal configured to receive a reference voltage; and
a second resistor having a first terminal connected to the network output of the second VRN and a second terminal configured to receive the reference voltage.

8. The VPR coupler of claim 1, wherein the first hybrid coupler is a 3 dB coupler.

9. The VPR coupler of claim 8, wherein the second hybrid coupler is a 3 dB coupler.

10. The VPR coupler of claim 1, wherein:
the first power is a radio frequency (RF) signal having the first power;
the second power is the RF signal having the second power; and
the third power is the RF signal having the third power.

11. The VPR coupler of claim 1, wherein the input of the amplifier is connected to a tap coupler connected to the coupler output of the second hybrid coupler, wherein the tap coupler is configured to transmit a portion of the third power to the amplifier input of the amplifier.

12. The VPR coupler of claim 1, wherein the portion of the third power is less than one percent (<1%) of the third power.

13. A variable power ratio directional (VPR) coupler network, comprising:
a plurality of N VPR couplers, each comprising:
a first hybrid coupler having a coupler input and a first coupler output, a second coupler output, and a third coupler output, wherein the coupler input of the first hybrid coupler is a VPR coupler input of a VPR coupler, and the third coupler output of the first hybrid coupler is a VPR coupler output of the VPR coupler;
a first variable reactive network (VRN) having a network input connected to the first coupler output of the first hybrid coupler, a network output, and a control voltage input;
a second VRN having a network input connected to the second coupler output of the first hybrid coupler, a network output, and a control voltage input; and
a second hybrid coupler having a first coupler input connected to the network output of the first VRN, a second coupler input connected to the network output of the second VRN, and a coupler output, wherein the output of the second hybrid coupler is a VPR output of the VPR coupler;
wherein each VPR coupler is configured to:
receive a first power at the coupler input of the first hybrid coupler;

receive a control voltage at the control voltage input of the first VRN and the control voltage input of the second VRN;

output, based on the control voltage, a second power to the third coupler output of the first hybrid coupler; and output, based on the control voltage, a third power to the coupler output of the second hybrid coupler, wherein a sum of the second power and the third power is the first power; and wherein the plurality of N VPR couplers is connected in a series, such that the VPR coupler input of each subsequent VPR coupler is connected to one of the VPR coupler outputs of the previous VPR coupler, and at least one VPR coupler output of each VPR coupler not connected to a VPR coupler input of another VPR coupler is configured to be connected to an input of one of a plurality of end units.

14. The VPR coupler network of claim 13, wherein each of the plurality of N VPR couplers receives a respective control voltage such that the VPR coupler output of each VPR coupler not connected to the VPR coupler input of another VPR coupler is configured to output (100/N) % of power received at the VPR coupler input of the first VPR coupler in the series.

15. The VPR coupler network of claim 13, wherein each of the plurality of N VPR couplers receives a respective control voltage such that the VPR coupler output of each VPR coupler not connected to the VPR coupler input of another VPR coupler is configured to output (100/(N−1))% of power received at the VPR coupler input of the first VPR coupler in the series.

16. The VPR coupler network of claim 13, wherein:

an output of a last VPR coupler in the series is connected to an input of a 3 db hybrid coupler; and each of the plurality of N VPR couplers receives a respective control voltage such that the VPR coupler output of each VPR coupler not connected to the VPR coupler input of another VPR coupler is configured to output (100/(N−2))% of power received at the VPR coupler input of the first VPR coupler in the series.

* * * * *